United States Patent
Sheng et al.

(10) Patent No.: US 12,386,550 B2
(45) Date of Patent: Aug. 12, 2025

(54) MEMORY DEVICE, MEMORY SYSTEM, AND METHOD FOR DATA CALCULATION WITH THE MEMORY DEVICE

(71) Applicant: YANGTZE MEMORY TECHNOLOGIES CO., LTD., Wuhan (CN)

(72) Inventors: Yue Sheng, Wuhan (CN); Shu Xie, Wuhan (CN); Weijun Wan, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 18/415,273

(22) Filed: Jan. 17, 2024

(65) Prior Publication Data

US 2025/0217072 A1     Jul. 3, 2025

Related U.S. Application Data

(63) Continuation of application No. PCT/CN2023/142313, filed on Dec. 27, 2023.

(51) Int. Cl.
    *G06F 3/06*            (2006.01)
(52) U.S. Cl.
    CPC ............ *G06F 3/0656* (2013.01); *G06F 3/061* (2013.01); *G06F 3/0679* (2013.01)
(58) Field of Classification Search
    CPC ....... G06F 3/0656; G06F 3/061; G06F 3/0679
See application file for complete search history.

(56) References Cited

U.S. PATENT DOCUMENTS

| | | | |
|---|---|---|---|
| 11,836,102 B1 * | 12/2023 | Mathuriya | ............ G06N 20/00 |
| 2018/0232273 A1 * | 8/2018 | Plants | ................. G06F 11/1068 |
| 2018/0240510 A1 | 8/2018 | Hush et al. | |
| 2019/0042199 A1 | 2/2019 | Sumbul et al. | |
| 2019/0317857 A1 | 10/2019 | Khan et al. | |

(Continued)

FOREIGN PATENT DOCUMENTS

| | | |
|---|---|---|
| KR | 10-2005-0022855 A | 3/2005 |
| KR | 10-2023-0014614 A | 1/2023 |

OTHER PUBLICATIONS

International Search Report issued in corresponding International Application No. PCT/CN2023/142313 mailed on Jun. 28, 2024, 3 pages.

(Continued)

*Primary Examiner* — Edward J Dudek, Jr.
(74) *Attorney, Agent, or Firm* — BAYES PLLC

(57) ABSTRACT

A memory device, a memory system, and a method for data calculation with the memory device are provided. The memory device includes an array of memory cells and a peripheral circuit coupled to the memory cells is provided. The peripheral circuit includes page buffers configured to store first data transmitted from a data interface of the memory device and to sense second data from the array of memory cells. The peripheral circuit further includes at least one process unit coupled to the page buffers via a data-path bus of the peripheral circuit and configured to perform calculation based on the first data and the second data. The peripheral circuit further includes a control logic configured to program the second data into the array of memory cells.

20 Claims, 15 Drawing Sheets

(56) References Cited

U.S. PATENT DOCUMENTS

| | | | |
|---|---|---|---|
| 2020/0243154 A1 | 7/2020 | Sity et al. | |
| 2023/0068645 A1 | 3/2023 | Fujiwara et al. | |
| 2023/0206967 A1 | 6/2023 | Park | |
| 2023/0317122 A1* | 10/2023 | Hung | G11C 16/26 |
| | | | 365/189.05 |
| 2023/0343373 A1* | 10/2023 | Skadron | G11C 7/1039 |
| 2024/0143541 A1* | 5/2024 | Fouda | G06F 15/80 |
| 2024/0257842 A1* | 8/2024 | Tanaka | G11C 16/30 |

OTHER PUBLICATIONS

International Search Report issued in corresponding International Application No. PCT/CN2023/142309, mailed on Jun. 28, 2024, 3 pages.

International Search Report issued in corresponding International Application No. PCT/CN2023/142312 mailed on Jun. 28, 2024, 3 pages.

* cited by examiner

MEMORY DEVICE, MEMORY SYSTEM, AND METHOD FOR DATA CALCULATION WITH THE MEMORY DEVICE

CROSS-REFERENCE TO RELATED APPLICATIONS

This application is a continuation of International Application No. PCT/CN2023/142313, filed on Dec. 27, 2023, entitled "MEMORY DEVICE, MEMORY SYSTEM, AND METHOD FOR DATA CALCULATION WITH THE MEMORY DEVICE," which is incorporated herein by reference in its entirety.

BACKGROUND

The present disclosure relates to a memory device, a memory system, and a method for data calculation with the memory device.

Generative artificial intelligence (AI) reasoning involves AI computation. For example, transformer models usually use a tensor processing unit (TPU) and a memory for computation. Large transformer models require a large amount of data and computation, which requires high power consumption and sufficient memory. When an access speed of memory lags behind the computation speed of the processor, a memory bottleneck will prohibit high-performance processors playing effectively, and forms a great constraint to high-performance computing (HPC), this problem is called the memory wall. It is desired to break through the memory wall to further improve the performance of AI systems.

SUMMARY

In one aspect, a memory device including an array of memory cells and a peripheral circuit coupled to the memory cells is provided. The peripheral circuit includes page buffers configured to store first data transmitted from a data interface of the memory device and to sense second data from the array of memory cells. The peripheral circuit further includes at least one process unit coupled to the page buffers via a data-path bus of the peripheral circuit and configured to perform calculation based on the first data and the second data. The peripheral circuit further includes a control logic configured to program the second data into the array of memory cells.

In some implementations, the first data includes at least one row. The control logic is further configured to control the page buffers to receive each row of the first data based on a first data pattern.

In some implementations, the first data pattern includes N first data segments with equal data length, where N is a positive integer and N≥2, a sequence of the N first data segments of the first data pattern is the same as a sequence of the first data; and every two adjacent first data segments of the first data pattern are separated by M first blank segments, where M is a positive integer and M≥2.

In some implementations, the data length of each first data segment is less than or equal to a bandwidth of the data-path bus.

In some implementations, the second data includes M columns. The control logic is further configured to program each column of the second data into the memory cells based on a second data pattern.

In some implementations, the control logic is further configured to program the second data into the memory cells in a single-level memory cell (SLC) mode.

In some implementations, the second data pattern includes N data groups each having M second data segments with equal data length from the M columns of the second data respectively. Every two adjacent data groups of the N data groups of the second data pattern are separated by one second blank segment, each second blank segment is corresponded to a first data segment respectively. The first data segment, the second data segment, the first blank segment, and the second blank segment are configured to have an equal data length.

In some implementations, each second data segment of the M second data segments of each data group of the N data groups is assigned with an error checking and correcting (ECC) code.

In some implementations, the data length of each second data segment is less than or equal to a bandwidth of the data-path bus.

In some implementations, the control logic is further configured to control the page buffers to sense the second data from the memory cells into the page buffers based on the second data pattern.

In some implementations, the control logic is further configured to control the page buffers to generate a third data having a third data pattern by performing an OR operation or an AND operation on the first data and the second data.

In some implementations, the third data pattern includes the N first data segments from the first data pattern and the N data groups each having M second data segments from the second data pattern. The M first blank segments between an ith first data segment and an (i+1)th first data segment of the N first data segments are replaced by the M second data segments of an ith data group of the N data groups, where i is a positive integer and N≥i≥1.

In some implementations, each of the at least one process unit includes M process elements configured to perform convolution operations based on the ith first data segment of the N first data segments and the M second data segments of an ith data group of the N data groups.

In some implementations, the control logic is further configured to control the page buffers to send the ith first data segment and the M second data segments to the M process elements.

In some implementations, each of the at least one process unit includes a control element configured to assign the ith first data segment to each process element of the M process elements and assign the M second data segments to the M process elements one-by-one based on the sequence of the M second data segments.

In some implementations, the control logic is further configured to obtain a calculation result and output the calculation result to the data interface.

In some implementations, the array of memory cells is divided into more than one plane of memory cells, and a number of the at least one process unit is equal to a number of the planes of memory cells. Each process unit corresponds to a corresponding one of the plurality of planes of memory cells respectively.

In some implementations, the array of memory cells is divided into more than one plane of memory cells, and a number of the at least one process unit is less than a number of the planes of memory cells.

In some implementations, a number of the at least one process unit is half of the number of the planes of memory cells and each process unit corresponds to two corresponding planes of memory cells respectively.

In some implementations, a number of the at least one process unit is a quarter of the number of the planes of memory cells and each process unit corresponds to four corresponding planes of memory cells respectively.

In some implementations, a number of the at least one process unit is one and the one process unit corresponds to the plurality of planes of memory cells.

In some implementations, the memory device includes a NAND flash memory.

In another aspect, a method for data calculation with a memory device including an array of memory cells and a peripheral circuit coupled to the memory cells is provided. The method includes: obtaining, by page buffers of the peripheral circuit, first data from a data interface of the memory device; sensing, by the page buffers of the peripheral circuit, second data from the array of memory cells; and performing calculation, by at least one process unit of the peripheral circuit, based on the first and the second data.

In some implementations, the method further includes programming the second data into the array of memory cells.

In some implementations, the first data includes at least one row. Obtaining the first data from a data interface of the memory device includes receiving each row of the first data based on a first data pattern.

In some implementations, the first data pattern includes N first data segments with equal data length, where N is a positive integer and N≥2, a sequence of the N first data segments of the first data pattern is the same as a sequence of the first data, and every two adjacent first data segments of the first data pattern are separated by M first blank segments, where M is a positive integer and M≥2.

In some implementations, the data length of each first data segment is less than or equal to a bandwidth of the data-path bus.

In some implementations, the second data includes M columns. Programming the second data into the array of memory cells includes programing each column of the second data into the memory cells based on a second data pattern.

In some implementations, the second data is programmed into the memory cells in a single-level memory cell (SLC) mode.

In some implementations, the second data pattern includes N data groups each having M second data segments with equal data length from the M columns of the second data respectively, every two adjacent data groups of the N data groups of the second data pattern are separated by one second blank segment, each second blank segment is corresponded to a first data segment respectively; and the first data segment, the second data segment, the first blank segment, and the second blank segment are configured to have an equal data length.

In some implementations, the data length of each second data segment is less than or equal to a bandwidth of the data-path bus.

In some implementations, sensing the second data from the array of memory cells includes sensing, by the page buffers of the peripheral circuit, the second data from the memory cells based on the second data pattern.

In some implementations, before performing calculation, further includes generating, by the page buffers, a third data having a third data pattern, by performing an OR r operation on the first data and the second data.

In some implementations, the third data pattern includes the N first data segments from the first data pattern and the N data groups each having M second data segments from the second data pattern. The M first blank segments between an ith first data segment and an (i+1)th first data segment of the N first data segments are replaced by the M second data segments of an ith data group of the N data groups, where i is a positive integer and N≥i≥1.

In some implementations, performing calculation based on the first and the second data includes performing, by M process elements of each of the at least one process unit, convolution operations based on the ith first data segment of the N first data segments and the M second data segments of an ith data group of the N data groups.

In some implementations, performing calculation based on the first and the second data includes sending the ith first data segment to each process element of the M process elements; and sending the M second data segments to the M process elements one-by-one.

In some implementations, the method further includes obtaining a calculation result and outputting the calculation result to the data interface.

In yet another aspect, a memory device including an array of memory cells and a peripheral circuit coupled to the memory cells is provided. The peripheral circuit includes page buffers configured to store first data transmitted from a data interface of the memory device and sense second data from the array of memory cells and at least one process unit coupled to the page buffers and configured to perform calculation based on the first data and the second data. The peripheral circuit further includes a control logic configured to control the page buffers to store a first piece of the first data and sense a first piece of the second data; store a second piece of the first data and sense a second piece of the second data consecutively; and store a third piece of the first data and sense a third piece of the second data consecutively. The control logic is further configured to control the at least one process unit to perform a first calculation based on the first piece of the first data and the first piece of the second data during sensing the second piece of the second data; and perform a second calculation based on the second piece of the first data and the second piece of the second data during sensing the third piece of the second data consecutively.

In some implementations, the control logic is further configured to output a first calculation result of the first piece of the first data and the first piece of the second data to the data interface during sensing the third piece of the second data.

In some implementations, the control logic is further configured to program the second data into the array of memory cells.

In some implementations, the first data includes at least one row. The control logic is further configured to control the page buffers to receive each row of the first data based on a first data pattern.

In some implementations, the first data pattern includes N first data segments with equal data length; a sequence of the N first data segments of the first data pattern is the same as a sequence of the first data; and every two adjacent first data segments of the first data pattern are separated by M first blank segments, where M is a positive integer and M≥2.

In some implementations, each piece of the first data includes one first data segment of the first data pattern.

In some implementations, the data length of each first data segment is less than or equal to a bandwidth of the data-path bus.

In some implementations, the second data includes M columns. The control logic is further configured to program each column of the second data into the memory cells based on a second data pattern.

In some implementations, the control logic is further configured to program the second data into the memory cells in a single-level memory cell (SLC) mode.

In some implementations, the second data pattern includes N data groups each having M second data segments with equal data length from the M columns of the second data respectively; every two adjacent data groups of the N data groups of the second data pattern are separated by one second blank segment, each second blank segment is corresponded to a first data segment respectively; and the first data segment, the second data segment, the first blank segment, and the second blank segment are configured to have an equal data length.

In some implementations, each piece of the second data includes one data group of the N data groups of the second data pattern.

In some implementations, each second data segment of the M second data segments of each data group of the N data groups is assigned with an error checking and correcting (ECC) code.

In some implementations, the data length of each second data segment is less than or equal to a bandwidth of the data-path bus.

In some implementations, the control logic is further configured to control the page buffers to sense the second data from the memory cells into the page buffers based on the second data pattern.

In some implementations, the control logic is further configured to control the page buffers to generate a third data having a third data pattern by performing an OR operation or an AND operation on the first data and the second data.

In some implementations, the third data pattern includes the N first data segments from the first data pattern and the N data groups each having M second data segments from the second data pattern. The M first blank segments between an ith first data segment and an (i+1)th first data segment of the N first data segments are replaced by the M second data segments of an ith data group of the N data groups, where i is a positive integer and N≥i≥1.

In some implementations, each of the at least one process unit includes M process elements configured to perform convolution operations based on the ith first data segment of the N first data segments and the M second data segments of an ith data group of the N data groups.

In some implementations, each of the control logic is further configured to control the page buffers to send the ith first data segment and the M second data segments to the M process elements.

In some implementations, each of the at least one process unit includes a control element configured to assign the ith first data segment to each process element of the M process elements and assign the M second data segments to the M process elements one-by-one based on the sequence of the M second data segments.

In some implementations, the array of memory cells is divided into more than one plane of memory cells, a number of the at least one process unit is equal to a number of the planes of memory cells. Each process unit corresponds to a corresponding one of the plurality of planes of memory cells respectively.

In some implementations, the array of memory cells is divided into more than one plane of memory cells, a number of the at least one process unit is less than a number of the planes of memory cell.

In some implementations, a number of the at least one process unit is half of the number of the planes of memory cells. Each process unit corresponds to two corresponding planes of memory cells respectively.

In some implementations, a number of the at least one process unit is a quarter of the number of the planes of memory cells. Each process unit corresponds to four corresponding planes of memory cells respectively.

In some implementations, a number of the at least one process unit is one and the one process unit corresponds to the plurality of planes of memory cells.

In some implementations, the memory device is a NAND flash memory.

In still another aspect, a system including a memory device and a controller is provided. The memory device includes an array of memory cells and a peripheral circuit coupled to the memory cells. The peripheral circuit includes page buffers configured to store first data transmitted from a data interface of the memory device and to sense second data from the array of memory cells; and at least one process unit coupled to the page buffers via a data-path bus of the peripheral circuit and configured to perform calculation based on the first data and the second data. The controller is coupled with the memory device and configured to transmit the first data into the memory device and receive a result of the calculation from the memory device.

In some implementations, the controller is further configured to transmit the second data into the memory device.

In some implementations, the memory device is a NAND flash memory.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

DETAILED DESCRIPTION

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Generative artificial intelligence (AI) reasoning involves AI computation. For example, transformer models, as a common model in AI systems, usually use a tensor processing unit (TPU) and a memory for computation. Large transformer models require a large amount of data and computation, which requires high power consumption and sufficient memory. When an access speed of memory lags behind the computation speed of the processor, a memory bottleneck will prohibit high-performance processors playing effectively, and forms a great constraint to high-performance computing (HPC), this problem is called the memory wall.

To address one or more aforementioned issues and break the memory wall, the present disclosure introduces a solution in which a memory device and a method for calculation with the memory device is provided. A plurality of process units is provided in a peripheral circuit of the memory device to perform calculations under the control of a control logic of the peripheral circuit. In this way, part of calculation tasks of the AI system can be distributed to the memory device of the AI system, especially tasks requiring large data-width. Without transferring the large data from the memory device to a processor of the AI system to perform calculations, the calculation tasks are completed within the memory device while the processor can process other calculations. Therefore, the calculation speed of the AI system is effectively improved by the introduction of the process units in the memory device.

Figure 1A:
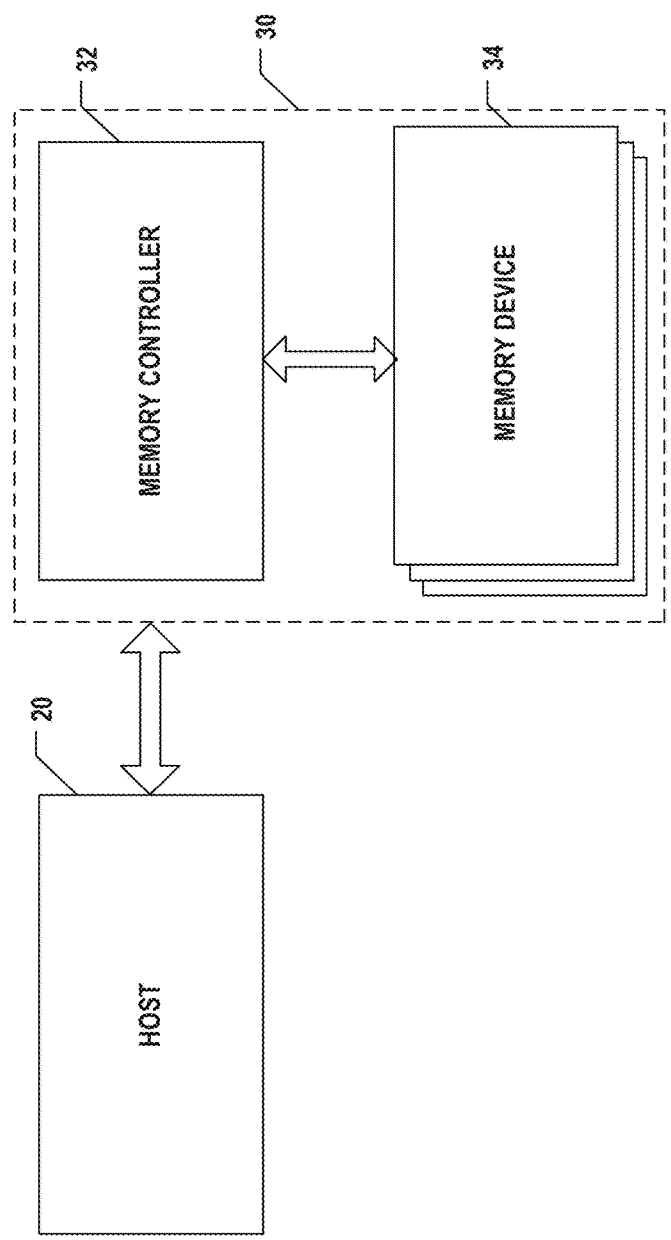
FIG. 1A illustrates a block diagram of a system having a memory device, according to some aspects of the present disclosure.

FIG. 1A illustrates a block diagram of a system 10 having a host 20 and a memory system 30, according to some aspects of the present disclosure. System 10 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, an artificial intelligence (AI) device, or any other suitable electronic devices having storage therein. As shown in FIG. 1, system 10 can include a host 20 and a memory system 30 having one or more memory devices 34 and a memory controller 32. Host 20 can be a processor of an electronic device, such as a tensor processing unit (TPU), a central processing unit (CPU), or a system-on-chip (SoC), such as an application processor (AP). Host 20 can be configured to send or receive data to or from memory system 30.

Memory device 34 can be any memory device disclosed in the present disclosure, such as NAND Flash Memory, Vertical NAND flash memory, Dynamic Random Access Memory (DRAM), Ferroelectric Random Access Memory (FRAM), Magneto resistive Random Access Memory (MRAM), Phase Change Random Access Memory (PCRAM), Resistive Random Access Memory (RRAM), Nano Random Access Memory (NRAM), and so on.

Memory controller 32 is coupled to memory device 34 and host 20 and is configured to control memory device 34, according to some implementations. Memory controller 32 can manage the data stored in memory device 34 and communicate with host 20. In some implementations, memory controller 32 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 32 is designed for operating in a high duty-cycle environment SSDs or embedded multi-media-cards (cMMCs) used as data storage for mobile devices, such as smartphones, tablets, laptop computers, etc., and enterprise storage arrays. Memory controller 32 can be configured to control operations of memory device 34, such as read, erase, and program operations. Memory controller 32 can also be configured to manage various functions with respect to the data stored or to be stored in memory device 34 including, but not limited to bad-block management, garbage collection, logical-to-physical address conversion, wear leveling, etc. In some implementations, memory controller 32 is further configured to process error correction codes (ECCs) with respect to the data read from or written to memory device 34. Any other suitable functions may be performed by memory controller 32 as well, for example, formatting memory device 34. Memory controller 32 can communicate with an external device (e.g., host 20) according to a particular communication protocol. For example, memory controller 32 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 1B:
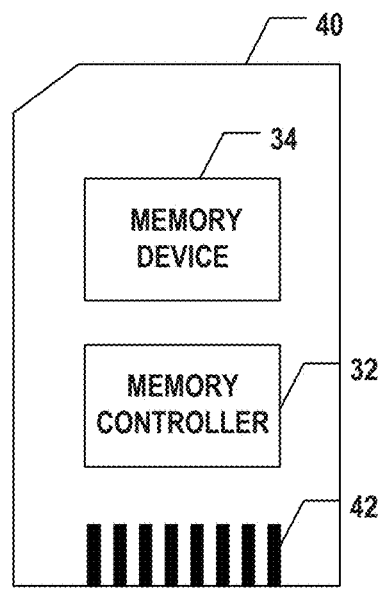
FIG. 1B illustrates a diagram of a memory card having a memory device, according to some aspects of the present disclosure.
Figure 1C:
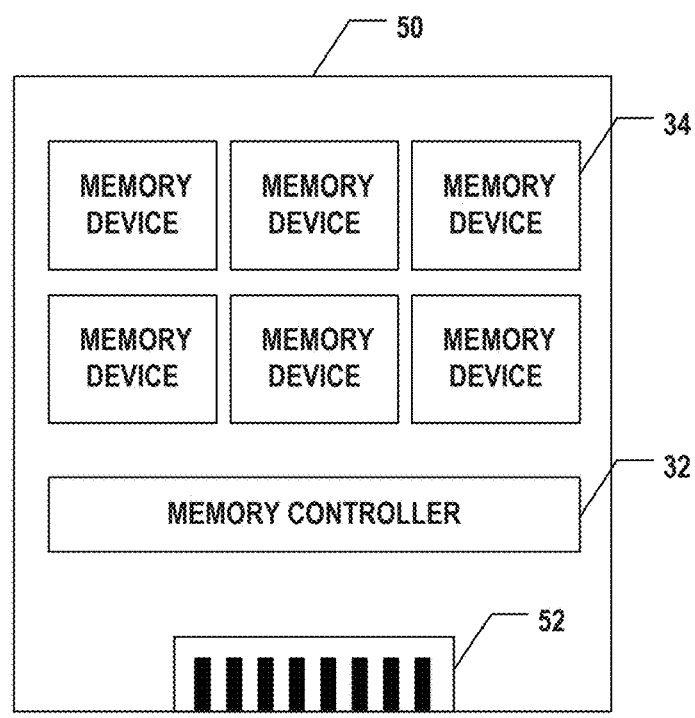
FIG. 1C illustrates a diagram of a solid-state drive (SSD) having a memory device, according to some aspects of the present disclosure.

Memory controller 32 and one or more memory devices 34 can be integrated into various types of storage devices, for example, be included in the same package, such as a universal Flash storage (UFS) package or an cMMC package. That is, memory system 30 can be implemented and packaged into different types of end electronic products. In one example as shown in FIG. 1B, memory controller 32 and a single memory device 34 may be integrated into a memory card 40. Memory card 40 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 40 can further include a memory card connector 42 coupling memory card 40 with a host (e.g., host 20 in FIG. 1). In another example as shown in FIG. 1C, memory controller 32 and multiple memory devices 34 may be integrated into an SSD 50. SSD 50 can further include an SSD connector 52 coupling SSD 50 with a host (e.g., host 20 in FIG. 1A). In some implementations, the storage capacity and/or the operation speed of SSD 50 is higher than those of memory card 40.

Figure 1D:
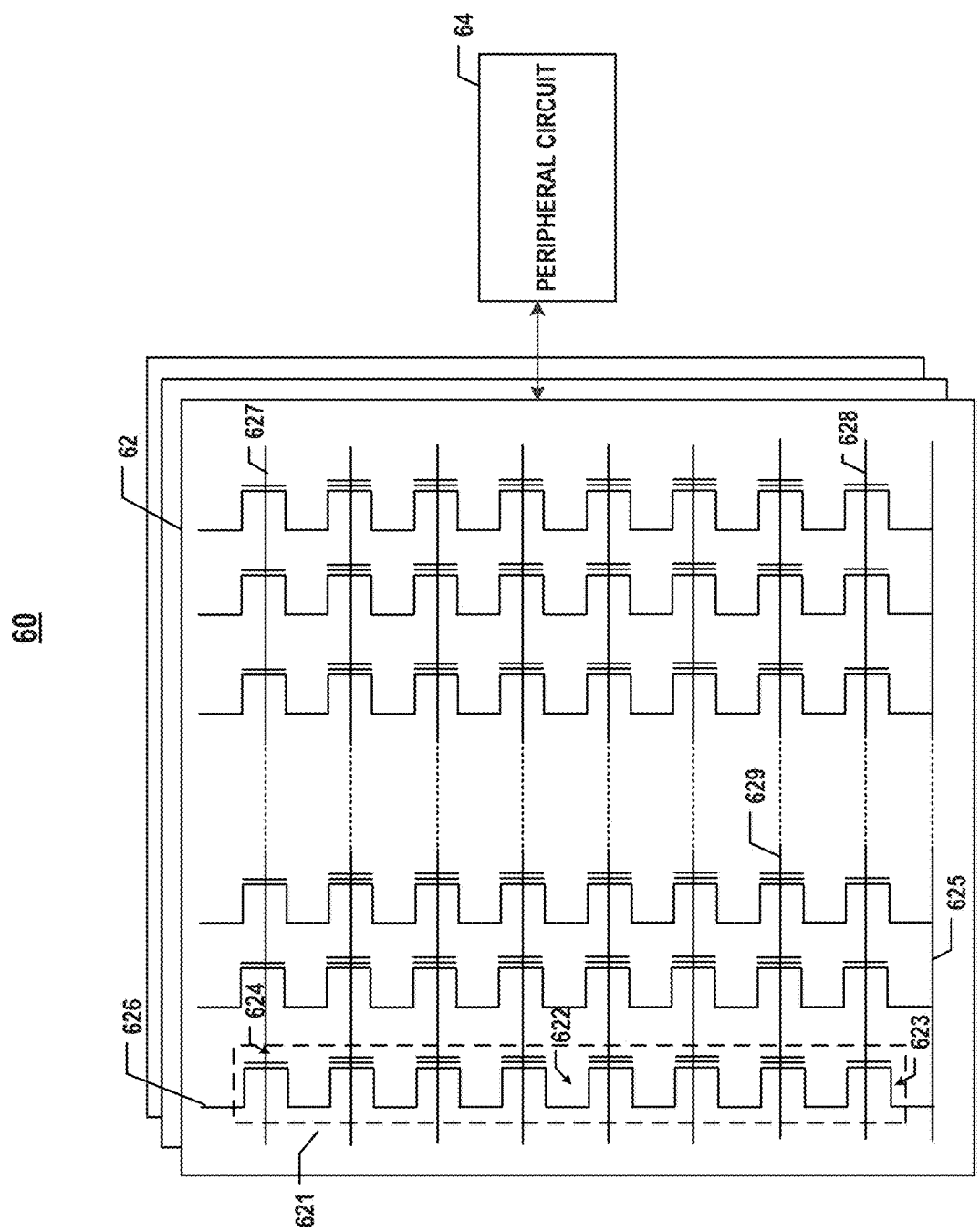
FIG. 1D illustrates a schematic diagram of a memory device including peripheral circuits, according to some aspects of the present disclosure.

FIG. 1D illustrates a schematic circuit diagram of a memory device 60 including peripheral circuits, according to some aspects of the present disclosure. Memory device 60 can be an example of memory device 34 in FIG. 1A. Memory device 60 can include a memory cell array 62 and peripheral circuits 64 coupled to memory cell array 62. Memory cell array 62 can be a NAND Flash memory cell array in which memory cells are provided in the form of an array of NAND memory strings 66 each extending vertically above a substrate (not shown). In some implementations, each NAND memory string 66 includes a plurality of memory cells coupled in series and stacked vertically. Each memory cell can hold a successive, analog value, such as an electrical voltage or charge, that depends on the number of electrons trapped within a region of the memory cell. Each memory cell can be either a floating gate type of memory cell including a floating-gate transistor or a charge trap type of memory cell including a charge-trap transistor.

In some implementations, each memory cell is a single-level cell (SLC) that has two possible memory states and thus, can store one bit of data. For example, the first memory state "0" can correspond to a first range of voltages, and the second memory state "1" can correspond to a second range of voltages. In some implementations, each memory cell is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 1Da schematic circuit diagram of an example memory device 60 including peripheral circuits, according to some aspects of the present disclosure. Memory device 60 can be an example of memory device 34 in FIG. 1A. Memory device 60 can include a memory cell array 62 and peripheral circuits 64 coupled to memory cell array 62. Memory cell array 62 can be a NAND Flash memory cell array in which memory cells 622 are provided in the form of an array of NAND memory strings 621 each extending vertically above a substrate (not shown). In some implementations, each NAND memory string 621 includes a plurality of memory cells 622 coupled in series and stacked vertically. Each memory cell 622 can hold a continuous, analog value, such as an electrical voltage or charge, that depends on the number of electrons trapped within a region of memory cell 622.

In some implementations, each memory cell 622 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 622 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 1D, memory cells 622 of adjacent NAND memory strings 621 can be coupled through word lines 629 that select which row of memory cells 622 is affected by read and program operations. Each NAND memory string 621 can include a source select gate (SSG) 623 at its source end and a drain select gate (DSG) 624 at its drain end. SSG 623 and DSG 624 can be configured to activate selected NAND memory strings 621 (columns of the array) during sense, read, and program operations. In some implementations, the sources of NAND memory strings 621 are coupled through a same source line (SL) 625, e.g., a common SL. In other words, all NAND memory strings 621 in the same block have an array common source (ACS), according to some implementations. DSG 624 of each NAND memory string 621 is coupled to a respective bit line 626 from which data can be read or written via an output bus (not shown), according to some implementations. In some implementations, each NAND memory string 621 is configured to be selected or deselected by applying a select voltage (e.g., above the threshold voltage of the transistor having DSG 624) or a deselect voltage (e.g., 0 V) to respective DSG 624 through one or more DSG lines 627 and/or by applying a select voltage (e.g., above the threshold voltage of the transistor having SSG 623) or a deselect voltage (e.g., 0 V) to respective SSG 623 through one or more SSG lines 628.

Figure 1E:
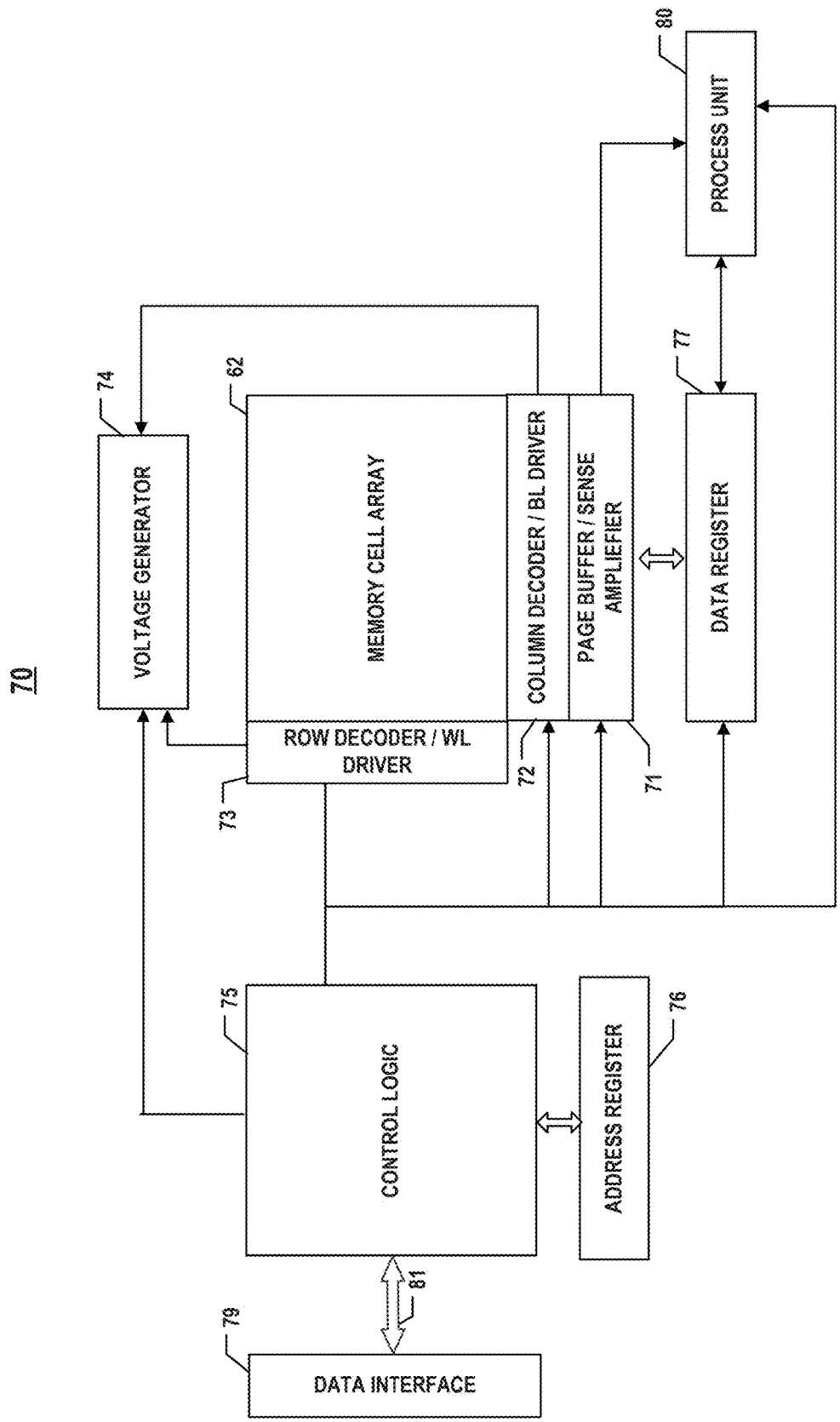
FIG. 1E illustrates a block diagram of a memory device including a memory cell array and peripheral circuits, according to some aspects of the present disclosure.

Referring to FIG. 1E, peripheral circuit 64 includes a Page Buffer (PB)/sense amplifier 71, a column decoder/bit line driver 72, a row decoder/word line driver 73, a voltage generator 74, a control logic 75, an address register 76, a data register 77, a data interface 79, a process unit 80, and a data-path bus 81. It should be understood that the above peripheral circuit 70 may be the same as the peripheral circuit 64 in FIG. 1D and in some other examples, peripheral circuit 70 may also include additional peripheral circuit not shown in FIG. 1E.

Page buffer/sense amplifier 71 can be configured to sense, read and program (write) data from and to memory cell array 62 according to the control signals from control logic 75. In one example, page buffer/sense amplifier 71 may store one page of program data (write data) to be programmed into one page of memory cell array 62. In another example, page buffer/sense amplifier 71 may perform program verify operations to ensure that the data has been properly programmed into memory cells coupled to selected word lines. In still another example, page buffer/sense amplifier 71 may also sense the low power signals from bit line that represents a data bit stored in memory cell and amplify the small voltage swing to recognizable logic levels in a read operation. Column decoder/bit line driver 72 can be configured to be controlled by control logic 75 and select one or more NAND memory strings 66 by applying bit line voltages generated from voltage generator 74.

Row decoder/word line driver 73 can be configured to be controlled by control logic 75 and select/deselect blocks of memory cell array 62 and select/deselect word lines of block. Row decoder/word line driver 73 can be further configured to drive word lines using word line voltages generated from voltage generator 74. In some implementations, row decoder/word line driver 73 can also select/deselect and drive SSG lines 628 and DSG lines 627 as well. As described below in detail, row decoder/word line driver 73 is configured to apply a read voltage to selected word line in a read operation on memory cell coupled to selected word line.

Voltage generator 74 can be configured to be controlled by control logic 75 and generate the word line voltages (e.g., read voltage, program voltage, pass voltage, local voltage, verification voltage, etc.), bit line voltages, and source line voltages to be supplied to memory cell array 62.

Control logic 75 can be coupled to each peripheral circuit described above and configured to control operations of each peripheral circuit. Address register 76 and data register 77 can be coupled to control logic 75 and configured for storing status information, command operation codes (OP codes), and command addresses for controlling the operations of each peripheral circuit. Data interface 79 can be coupled to control logic 75 through a data-path bus 81 and act as a control buffer to buffer and relay control commands received from a host (not shown) to control logic 75 and status information received from control logic 75 to the host. Data interface 79 can also be coupled to column decoder/bit line driver 72 and act as a data input/output (I/O) interface and a data buffer to buffer and relay the data to and from memory cell array 62. Data interface 79 can also be coupled to data register 77 and process unit 80 to receive calculation results of process unit 80 and send the results to memory controller 32 or host 20.

Figure 1F:
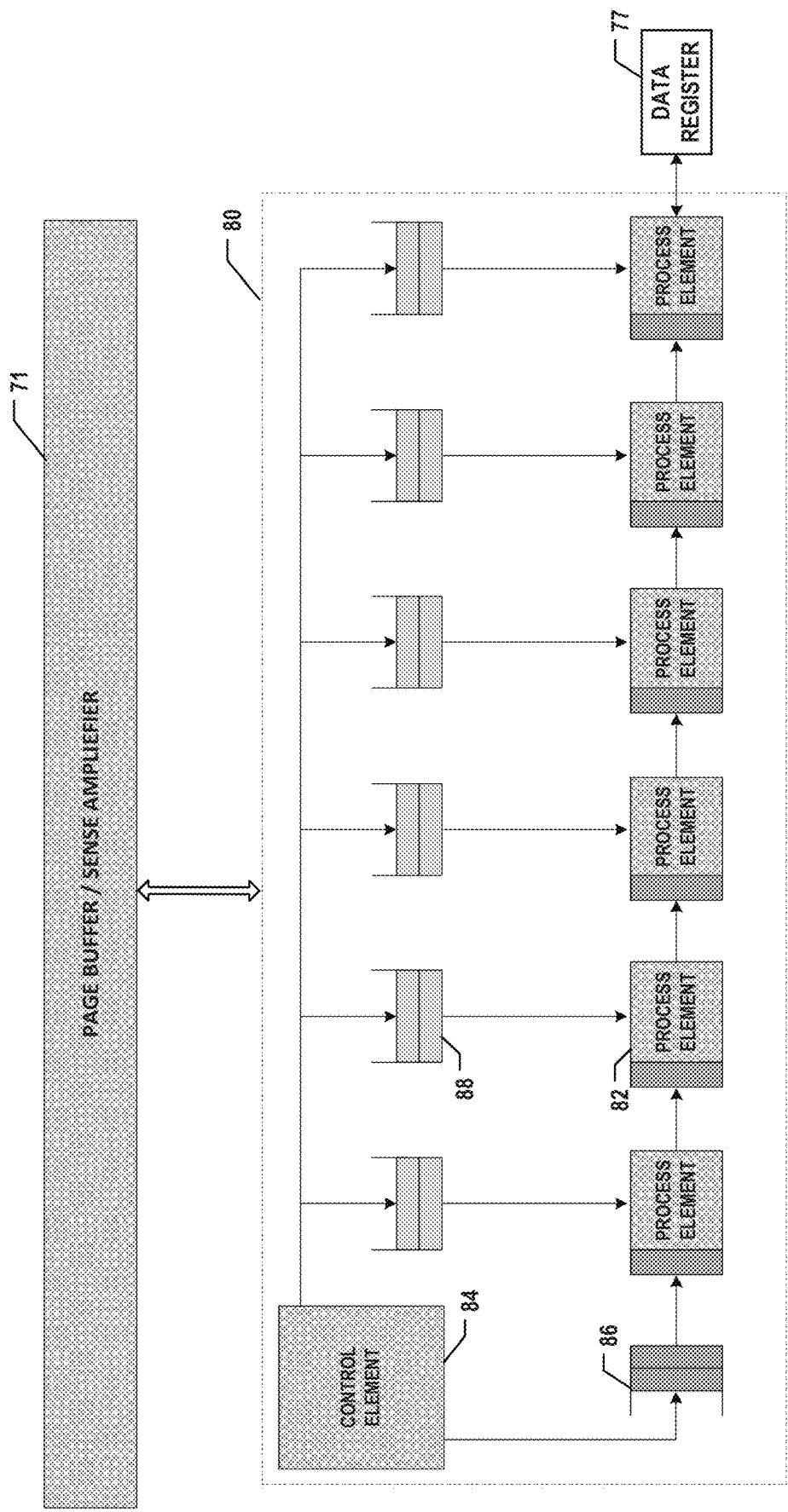
FIG. 1F illustrates a block diagram of a process unit, according to some aspects of the present disclosure.

As shown in FIG. 1F, process unit 80 is illustrated. Process unit 80 includes a plurality of process elements 82, at least one first register 86, a plurality of second registers 88, and a control element coupled with the first and second registers 86 and 88. Process unit 80 can be coupled with page buffers 71 through a plurality of first registers 86 to receive first data from data latched of page buffers 71 and a plurality of second registers 88 to receive second data from memory cell array 62. The second data can be sensed by page buffers 71 from memory cell array 62. Process unit 80 further includes a plurality of process elements 82 coupled with the first registers 86 and second registers 88 and configured to perform convolution calculation based on the first data and the second data. Each process element 82 can include a result register configured to store a calculation result generated by the corresponding process element. A number of process element 82 equals a number of second registers 88 and a number of the columns of the second data. In the present implementation, each process unit includes six process elements and six second registers 88. Process unit 80 further includes a control element 84 configured to assign the first data and the second data to the plurality of process elements 82 according to preset data patterns. In some implementations, a number of the at least one first register 86 equals to a number of rows of the first data. For example, in the present implementation, each process unit 80 includes one first register 86. In some implementations, first registers 86 and the second registers 88 are first-in-first-out (FIFO) registers.

Figures 2A, 2B:
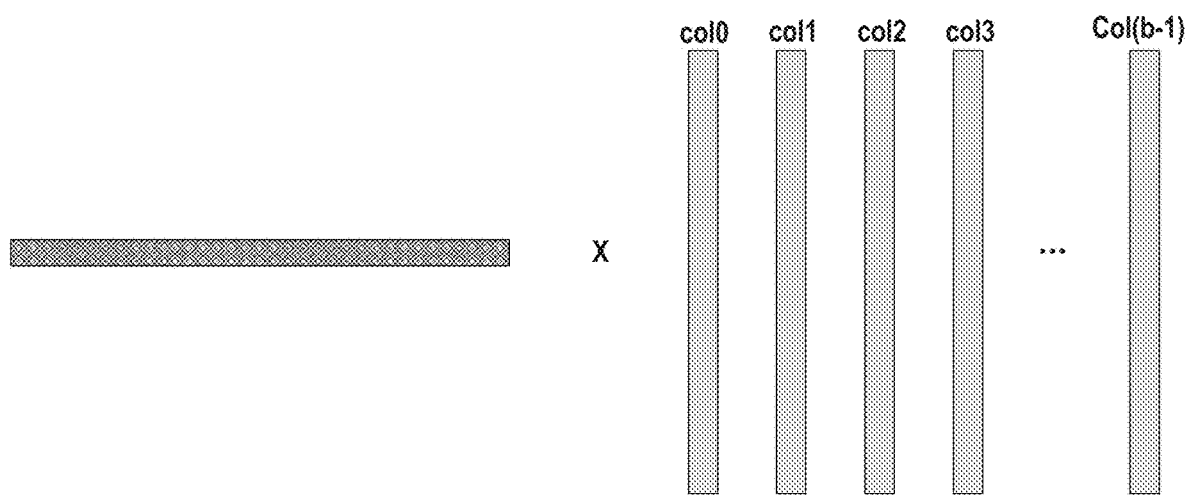
FIG. 2A illustrates first and second data processed by a memory device, according to some aspects of the present disclosure.
FIG. 2B illustrates data shapes of the first and second data in FIG. 2A, according to some aspects of the present disclosure.

AI systems are mainly used in two aspects: training and inference, and the present disclosure can be mainly used in AI inference, in which data in input into a trained AI module to be recognized and analyzed to obtain an expected result of the input data. In AI inference, calculations are performed based on the input data and data prestored in the AI system to confirm one or more nature of the input data. In AI inference, the input data may be a one-dimensional data and the reference data may be a two-dimensional data in many cases, as shown in FIG. 2A, in which the first data is a one-dimensional vector, and the second data is a two-dimensional matrix. In Ai systems, three modules are provided to perform data calculations. The first module is computing near memory device, in which the calculations are performed outside the memory device. The second module is computing in memory cells, in which the calculations are performed by the memory cells of the memory device. The third module is processing in memory cells, in which the calculations are performed by additional process units of the memory device. The third module, i.e., processing in memory cells, is employed in the implementations of the present disclosure.

FIG. 2B illustrates equivalence shapes of the first data and the second data in FIG. 2A. In some implementations, the one-dimensional first data can be equivalated as a row of data with a length of a, and the two-dimensional second data, i.e., the a×b matrix, can be equivalated as b columns, each column has a length of a. In some implementations, the first data can be a two-dimensional matrix including more than one row with an equal data length, and a dimensionality reduction can be performed on the more than one row of the first data to break the first data into a plurality of single row to apply the present disclosure.

In some implementations, the first data and second data can be preprocessed before being processed to perform convolution in the memory device. In some implementations, the first data and second data can be preprocessed based on a first data pattern and a second data pattern as shown in FIG. 2C.

Figure 2C:
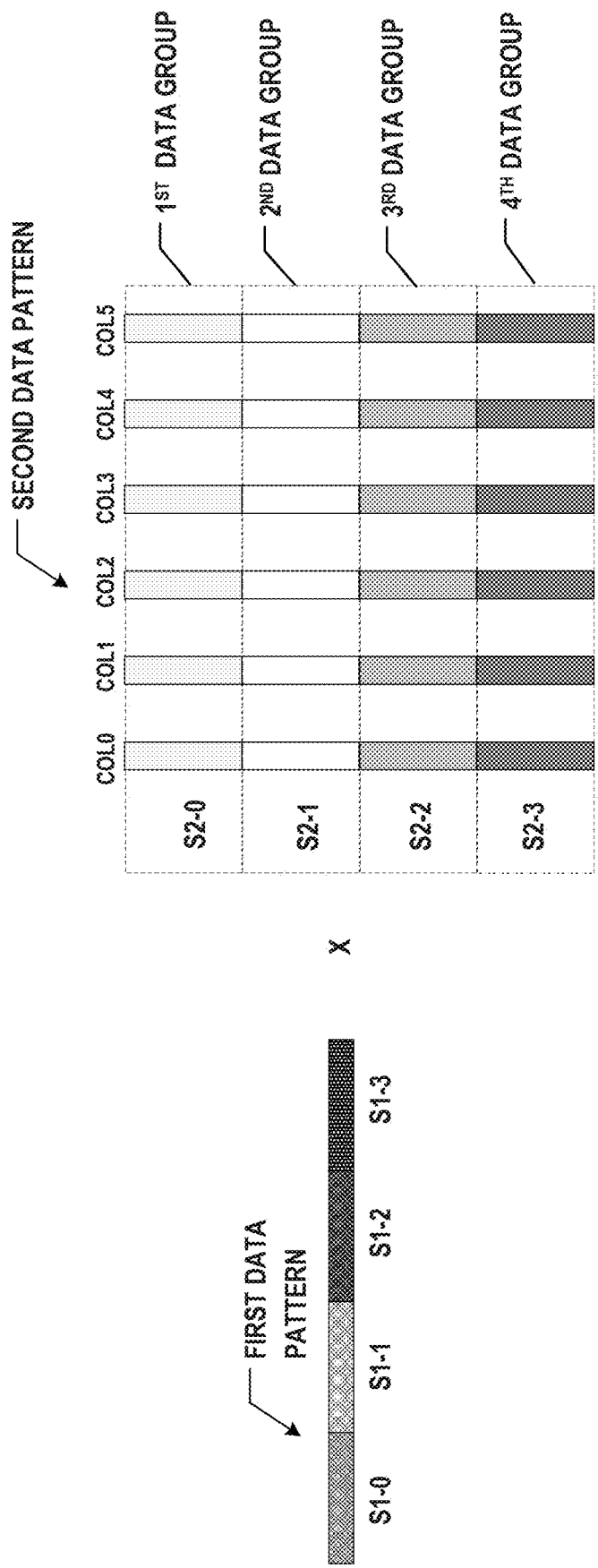
FIG. 2C illustrates a first data pattern and a second data pattern used for processing the first data and the second data in FIG. 2A respectively, according to some aspects of the present disclosure.
Figure 2D:
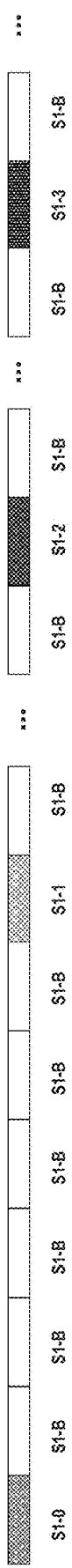
FIG. 2D illustrates a storage map of the second data in FIG. 2A based on the second data pattern in FIG. 2C, according to some aspects of the present disclosure.

In some implementations, the first data includes one row, and control logic 75 is configured to control page buffers 71 to obtain and send the row of the first data to the at least one process unit 80 based on a first data pattern as shown in FIG. 2C and FIG. 2D. The first data pattern includes N first data segments with equal length, where N is a positive integer and N≥2. In some implementations, referring to FIG. 2D, every two adjacent first data segments of the first data pattern are separated by M first blank segments. For example, N=4 is taking as an example to illustrate the present disclosure, referring to FIG. 2D, the first data includes four first data segments based on the first data pattern, i.e., first data segment S1-0, first data segment S1-1, first data segment S1-2, and first data segment S1-3. Six first blank segments are arranged between first data S1-0 and first data segment S1-1, six first blank segments are arranged between first data segment S1-1 and first data segment S1-2, six first blank segments are arranged between first data segment S1-2 and first data segment S1-3, six first blank segments are arranged between first data segment S1-3 and consecutive first data segment. In some implementations, the first blank segments can be fulfilled with "1" instead of being blank. In some implementations, the first blank segments can be fulfilled with "0" instead of being blank.

The sequence of the four first data segments of the first data pattern is the same as a sequence of the first data. In some implementations, the data length of each first data segment is less than or equal to the bandwidth of the data-path bus. The first data segments and the first blank segments are configured to have equal data length. In some implementations, an error checking and correcting (ECC) code is assigned to each first data segment to verify the first data segment. The ECC code can also be used as an identifier to recognize each first data segment of the first data pattern.

Figure 2E:
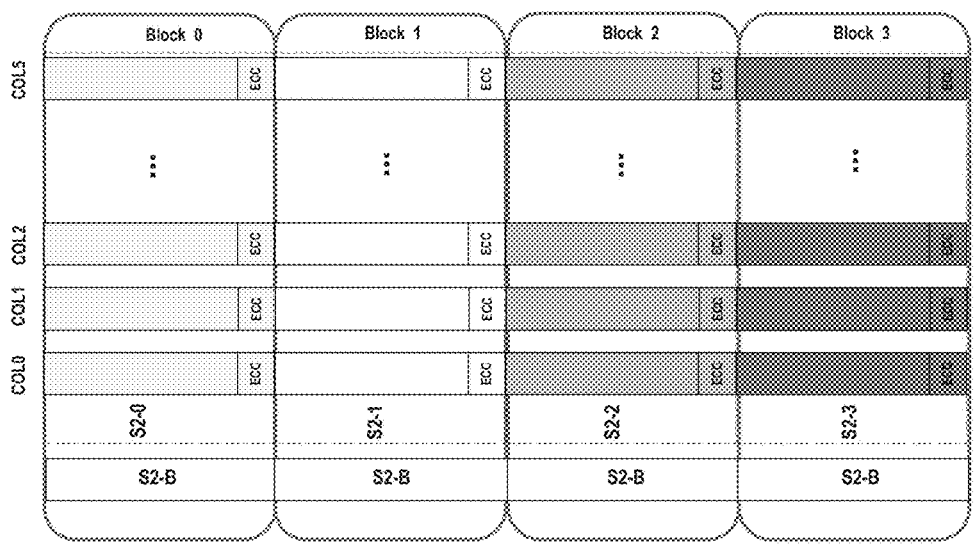
FIG. 2E illustrates a data flow in page buffers of the memory device, according to some aspects of the present disclosure.
Figure 2E:
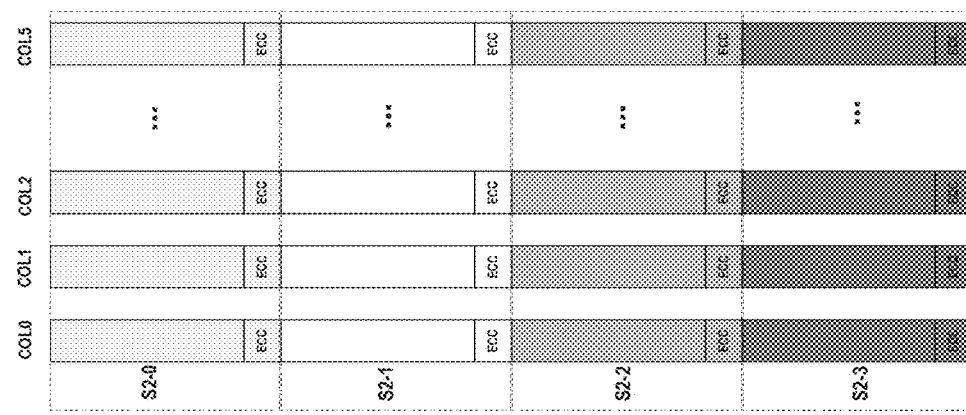
Figure 2E:
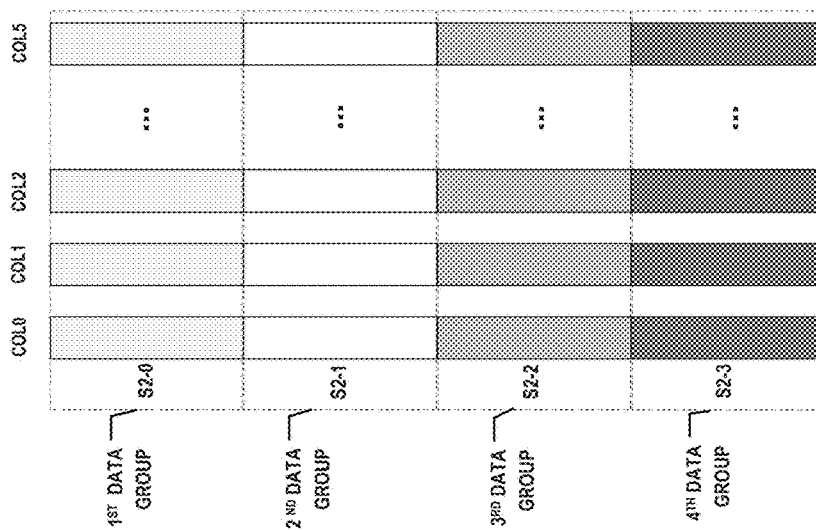

In some implementations, the second data includes M columns, where M is a positive integer and M≥2. Control logic 75 is configured to program each column of the second data into the memory cells of memory cell array 62 based on a second data pattern as shown in FIG. 2C and FIG. 2E. The second data pattern includes N data groups each having M second data segments with equal data length from the M columns of the second data respectively, and the first data segment and the second data segment are configured to share an equal data length. Every two adjacent data groups of the N data groups of the second data pattern are separated by one second blank segment, and each second blank segment is corresponded to a first data segment respectively. For example, N=4 and M=6 are taking as examples to illustrate the present disclosure. As shown in FIG. 2C, the second data includes six columns, i.e., Column 1, Column2, Column3, Column4, Column5, and Column6. Each column of the six columns includes four second data segments, i.e., second data segment S2-0, second data segment S2-1, second data segment S2-2, and second data segment S2-3. Referring to FIG. 2C, the six second data segments S2-0 are regrouped as a first data group of the second data pattern, the six second data segments S2-1 are regrouped as a second data group of the second data pattern, the six second data segments S2-2 are regrouped as a third data group of the second data pattern, and the six second data segments S2-3 are regrouped as a fourth data group of the second data pattern. Referring to FIG. 2E, the first data group of the second data is separated from a proceeding data group of the second data by second blank segment S2-0, the second data group of the second data is separated from the first data group of the second data by second blank segment S2-1, the third data group of the second data is separated from the second data group of the second data by second blank segment S2-2, and the fourth data group of the second data is separated from the third data group of the second data by second blank segment S2-3. In some implementations, the second blank segments can be fulfilled with "1" instead of being blank. In some implementations, the first blank segments can be fulfilled with "0" instead of being blank.

In some implementations, referring to FIG. 2C and FIG. 2E, each data group of the four data groups of the second data pattern are programmed into the memory cell array 62 successively, i.e., logic addresses of the data of each data group are successive, so that the data of a same data group can be sensed into page buffers 71 at the same time. For example, in some implementations, six second data segments S2-0 of the first data group and one second blank segment S2-B are successively programmed in block 0 of memory cell array 62, six second data segments S2-1 of the second data group and one second blank segment S2-B are successively programmed in block 1 of memory cell array 62, six second data segments S2-2 of the third data group and one second blank segment S2-B are successively programmed in block 2 of memory cell array 62, and six second data segments S2-3 of the first data group and one second blank segment S2-B are successively programmed in block 3 of memory cell array 62.

In some implementations, a capacity of each block of memory cell array 62 is larger than at least twice of a data length of each data group, then two more data groups can be programmed within a same block of memory cell array 62 successively. In some implementations, the capacity of each block of memory cell array 62 is less than the data length of each data group, then each data group can be programmed in two successive blocks of memory cell array 62. The sequence of the second data segments of the second data pattern is the same as a sequence of the second data. In some implementations, the data length of each second data segment is less than or equal to the bandwidth of the data-path bus. The first data segments, the first blank segments, the second data segments, and the second blank segments are configured to have equal data length. In some implementations, an error checking and correcting (ECC) code is assigned to each second data segment to verify the second data segment. The ECC code can also be used as an identifier to recognize each second data segment of the second data pattern.

Figure 2F:
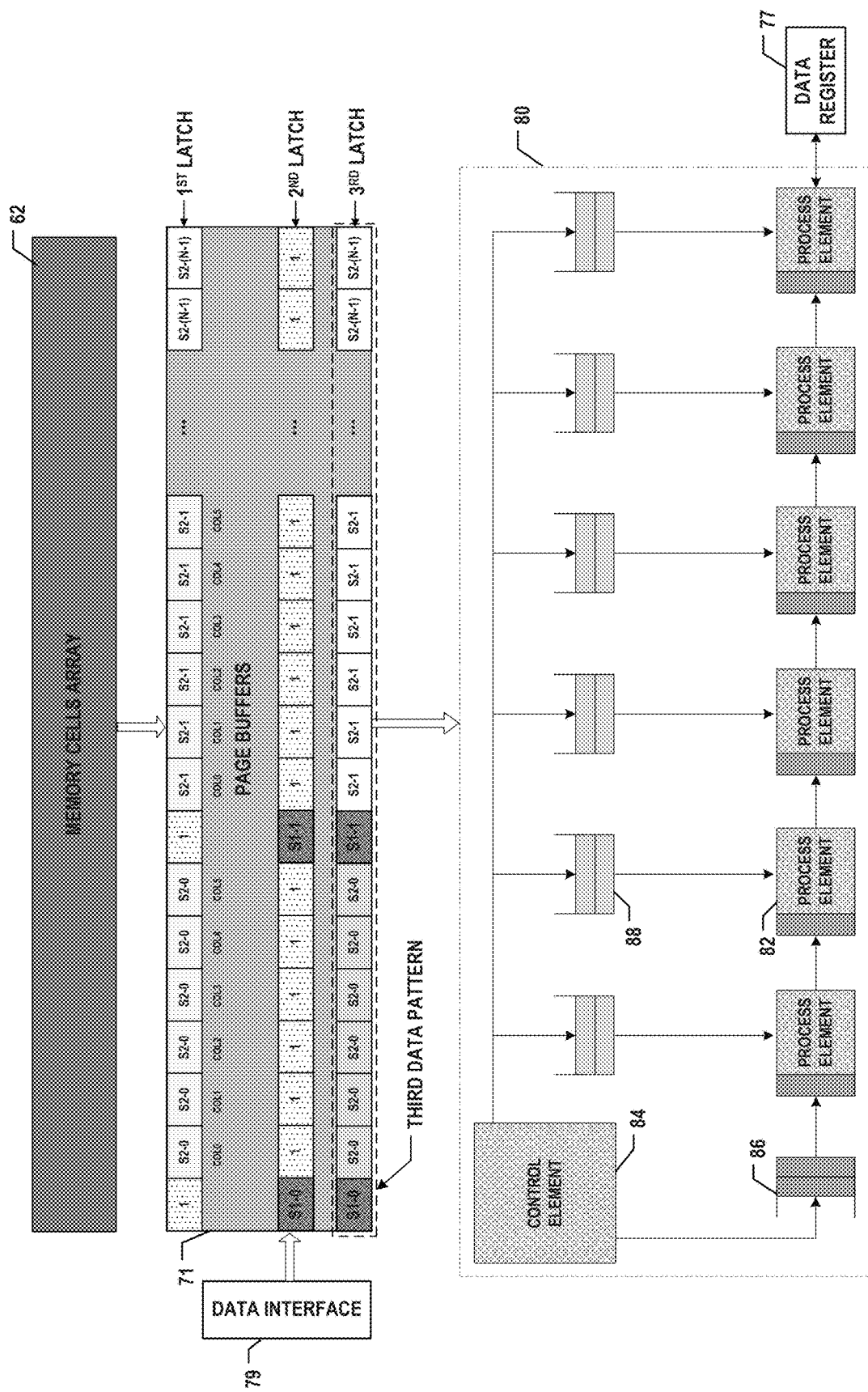
FIG. 2F illustrates a data flow within the memory cell array, the page buffer, and the process unit, according to some aspects of the present disclosure.

In some implementations, referring to FIG. 2F, control logic 75 is further configured to control page buffer 71 to obtain the first data and the second data and send them to the at least one process unit 80 based on the data sequence of the first data pattern and the second data pattern in FIG. 2C.

In some implementations, the first data is sent into a second latch of page buffers 71 from data interface 79 based on the first data pattern, as shown in FIG. 2D and FIG. 2F, every two adjacent first data segments are separated by M first blank segments. The second data is sensed into a first latch of page buffers 71 from memory cell array 62 based on the second data pattern, as shown in FIG. 2E and FIG. 2F, every two adjacent data group of the second data are separated by one second blank segment.

Control logic 75 is further configured to control the page buffers 71 to generate a third data having a third data pattern by performing an OR operation or an AND operation on the first data and the second data. The third data pattern includes the N first data segments from the first data pattern and the N data groups each having M second data segments from the second data pattern. The M first blank segments between an ith first data segment and an (i+1)th first data segment of the N first data segments are replaced by the M second data segments of an ith data group of the N data groups, where i is a positive integer and N≥i≥1. In some implementations, the first blank segments and second blank segments are filled with "1" and will be replaced by the corresponding second data segments and first data segments after an AND operation. In some implementations, the first blank segments and second blank segments are filled with "0" and will be replaced by the corresponding second data segments and first data segments after an OR operation.

Control logic 75 is configured to control the page buffers to send the ith first data segment and the M second data segments to the M process elements. Referring to FIG. 2F, at least one process unit 80 includes M process elements 82 configured to perform convolution operations based on the ith first data segment of the N first data segments and the M second data segments of an ith data group of the N data groups. Each of the at least one process unit 80 further includes a control element 84 configured to assign the ith first data segment to each process element of the M process elements and assign the M second data segments to the M process elements correspondingly based on the sequence of the M second data segments.

Figure 3A:
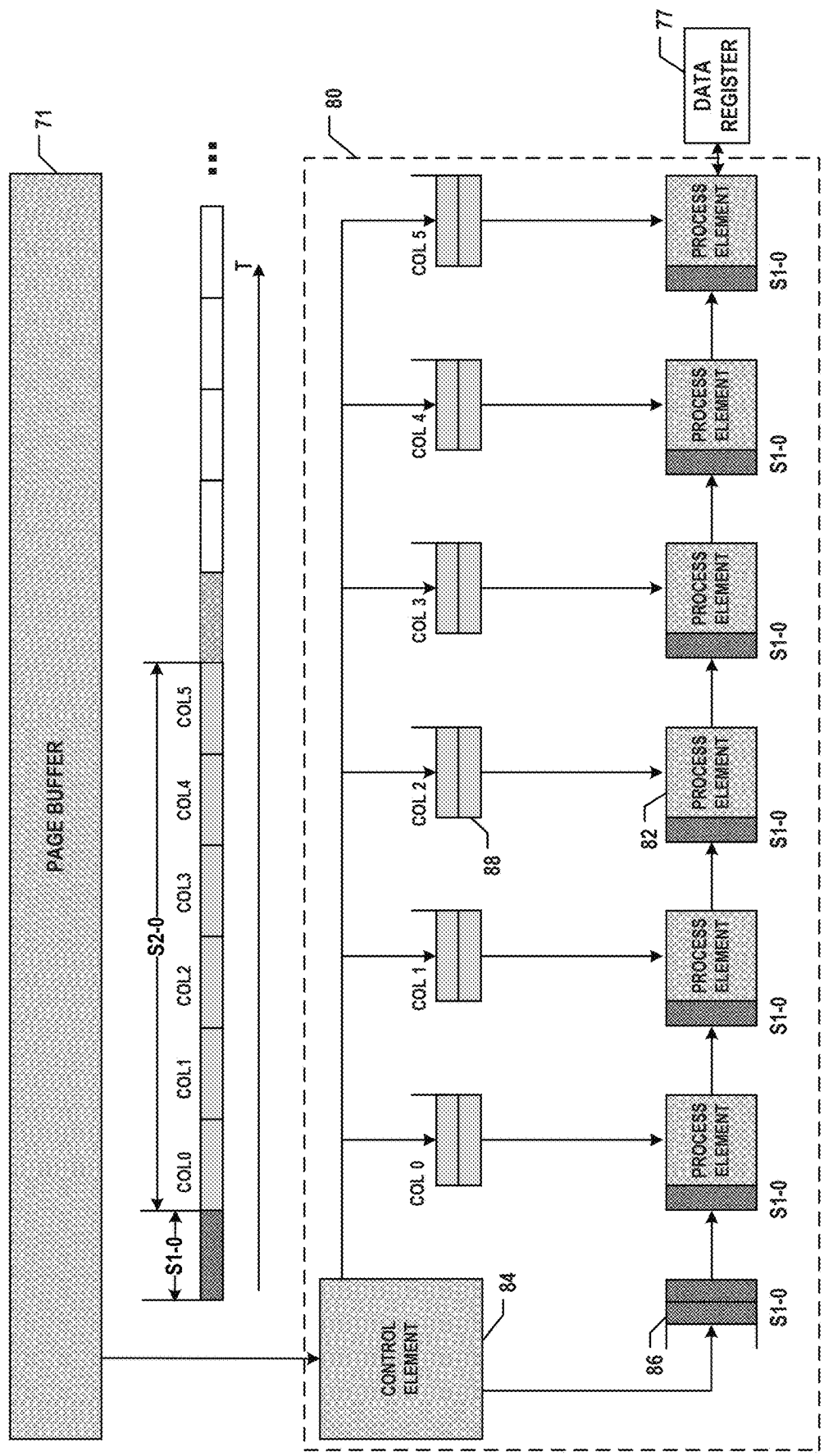
FIG. 3A illustrates a data flow in a process unit of the memory device, according to some aspects of the present disclosure.
Figure 3B:
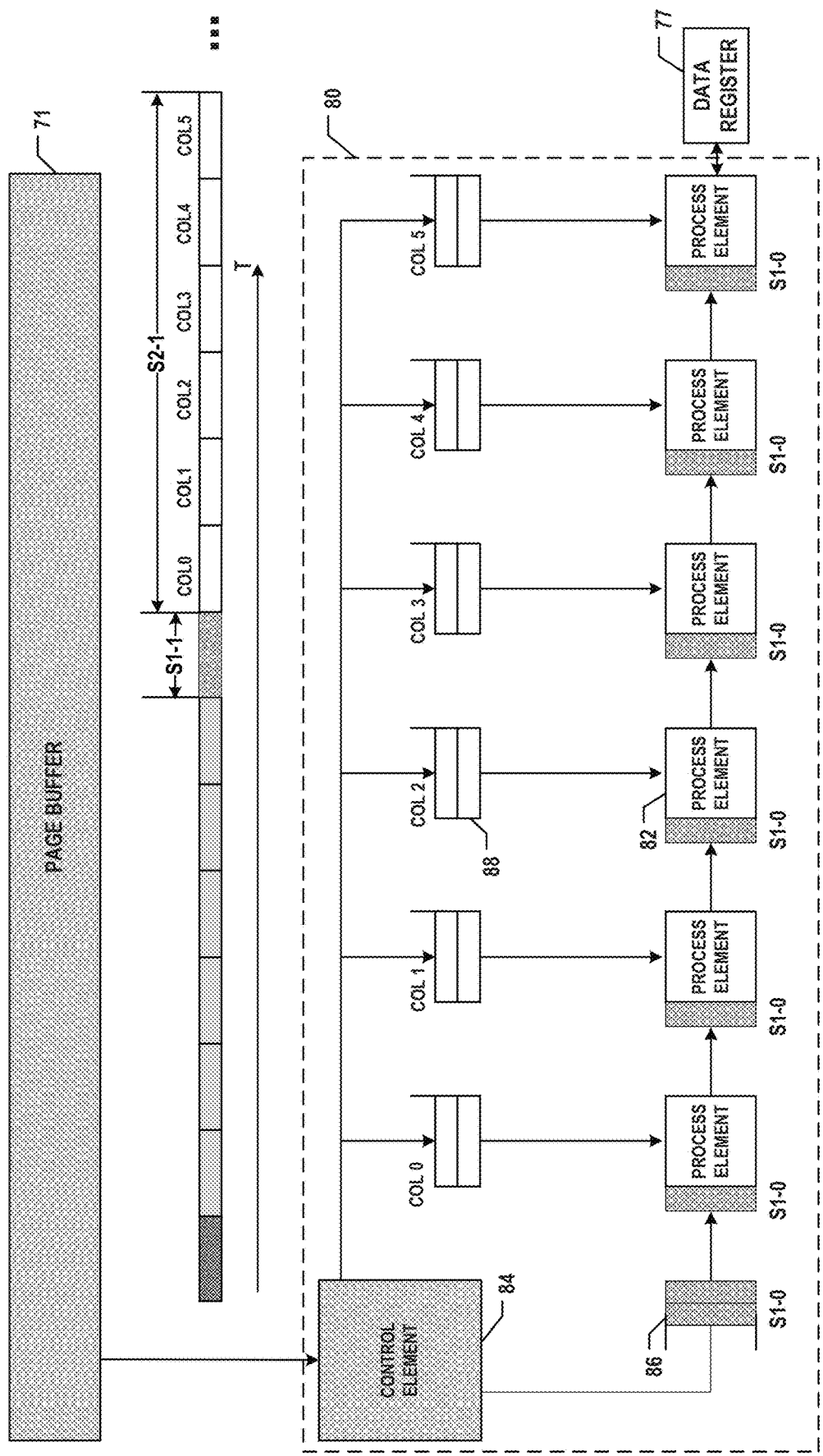
FIG. 3B illustrates a data flow in a process unit of the memory device, according to some aspects of the present disclosure.

For example, first data segment S1-0 is sent into process unit 80 at first as shown in FIG. 3A, and first data segment S1-1 is sent into process unit 80 after first data segment S1-0 consecutively as shown in FIG. 3B. First data segment S1-2 and first data segment S1-3 are sent into process unit 80 consecutively after first data segment S1-1 (not shown). Taking first data segment S1-0 as an example, in some implementations, first data segment S1-0 is sent to and buffered in the first register 86. In some implementations, each process unit includes a control element configured to assign the first data segment S1-1 to each process element 82, as shown in FIG. 3A.

In some implementations, control logic 75 is further configured to control page buffers 71 to sense and send the data groups of the second data pattern to the at least one process unit 80 based on the data sequence of the second data pattern in FIG. 2C. For example, the six second data segments S2-0 of the first data group are sent into process unit 80 at first as shown in FIG. 3A, and the six second data segments S2-1 of the second data group are sent into process unit 80 after the first data group consecutively as shown in FIG. 3B. The six second data segments S2-2 of the third data group of the second data are sent into process unit 80 consecutively after the second data group, and the six second data segments S2-3 of the fourth data group of the second data are sent into process unit 80 consecutively after the third data group (not shown). Taking the six second data segments S2-0 as an example, in some implementations, the six second data segments S2-1 are sent to and buffered in the six second register 88. In some implementations, each process unit includes a control element configured to assign the six second data segments S2-1 to the six process elements correspondingly based on the sequence of the six second data segments S2-1, as shown in FIG. 3A.

In some implementations, the M process elements 82 of each process unit 80 is configured to perform convolution operations based on an ith first data segment of the N first data segments and the M second data segments of an ith data group of the N data groups, where i is a positive integer and N≥i≥1. Referring to FIG. 3A and FIG. 3B, in the present implementation, the first data segment S1-0 is sent to each of the six process elements 82, the six second data segments S2-0 of the first data group of the second data are sent to the six process elements 82 one-by one, and convolution operations are performed by the six process elements 82 based on the first data segment S1-0 and the six second data segments S2-0 and obtain a first calculation result. In some implementations, the first calculation result is then sent to and saved in the corresponding result register of each process element 82 to perform further operations. In some implementations, the first calculation result can then be sent to and saved in data interface 79 under the control of control logic 75. In some implementations, the first calculation result is then sent to and saved in memory cell array 62 under the control of control logic 75. The first data segment S1-1 and the six second data segments S2-1 are then sent to the six process elements 82 to perform convolution operations and generate a second calculation result. The second calculation result is then sent to corresponding result register, data interface 79, or memory cell array 62 by control logic 75 consecutively.

Figure 4:
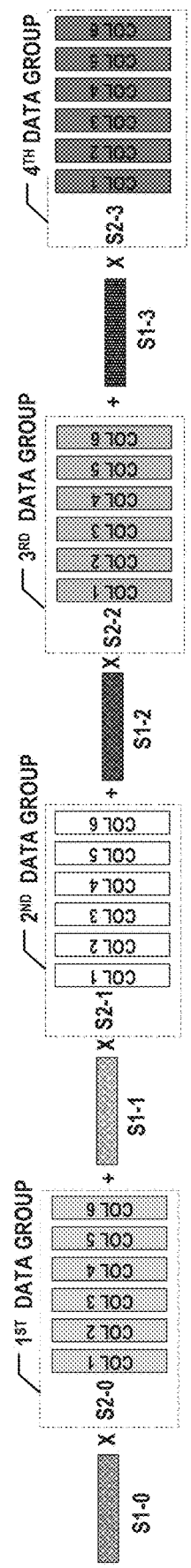
FIG. 4 illustrates a process used for processing the first data and the second data in FIG. 2A based on the first data pattern and the second data pattern in FIG. 2C, according to some aspects of the present disclosure.

A calculation principle of the at least one process unit is provided in FIG. 4, in which the ith first data segment is multiplied with the M second data segments of an ith data group of the N data groups to obtain an ith result. The N ith results are accumulated to obtain a convolution result. In some implementations, peripheral circuit 70 includes one process unit 80, then the convolution operations between the calculations N first data segments and the N data groups of the second data are performed by the one process unit 80 consecutively. In some implementations, peripheral circuit 70 includes more than one process unit 80, then the convolution operations between the calculations N first data segments and the N data groups of the second data are performed by different process unit 80 at the same time respectively.

At least one process unit 80 is set within peripheral circuit 70 independently and is a separate module. With an increasement of a number of the at least one process unit 80 within peripheral circuit 70, the calculation speed of peripheral circuit 70 improved while a larger area of peripheral circuit 70 is needed, there is a trade-off between the calculation speed and the area of peripheral circuit 70. In some implementations, memory cell array 62 is divided into more than one plane of memory cells, each plane includes a plurality of memory cells. The number of the at least one process unit 80 is equal to a number of the planes of memory cells, which means that the at least one process unit 80 corresponds to the plurality of planes of memory cells one-by-one. For example, memory cell array 62 is divided into 128 planes of memory cells, and the number of at least one process unit 80 is also 128. In some implementations, the number of the at least one process unit 80 is less than a number of the planes of memory cells. For example, memory cell array 62 is divided into 128 planes of memory cells, and the number of at least one process unit 80 may be 100, 64, 50, or other numbers less than 128. In some implementations, the number of at least one process unit 80 is half of the number of the planes of memory cells, and one process unit corresponds to two planes of memory cells respectively. For example, memory cell array 62 is divided into 128 planes of memory cells, and the number of at least one process unit 80 is 64. In some implementations, the number of at least one process unit 80 is a quarter of the number of the planes of memory cells, and one process unit corresponds to four planes of memory cells respectively. For example, memory cell array 62 is divided into 128 planes of memory cells, and the number of at least one process unit 80 is 32. The number of at least one process unit 80 can be set and adjusted based on the need of the AI system, the implementations of the present disclosure aim to illustrate the present disclosure and should not be explained as limitations.

In another aspect of the present disclosure, control logic 75 of peripheral circuit 70 is configured to control page buffers 71 to obtain a first piece of the first data, a second piece of the first data, and a third piece of the first data consecutively. Control logic 75 of peripheral circuit 70 is further configured to control page buffers 71 to sense a first piece of the second data, a second piece of the second data, and a third piece of the second data consecutively. Control logic 75 of peripheral circuit 70 is further configured to perform a first calculation based on the first piece of the first data and the first piece of the second data during sensing the second piece of the second data and perform a second calculation based on the second piece of the first data and the second piece of the second data during sensing the third piece of the second data consecutively. Control logic 75 of peripheral circuit 70 is further configured to output a first calculation result of the first piece of the first data and the first piece of the second data to the data interface during sensing the third piece of the second data.

Figure 5:
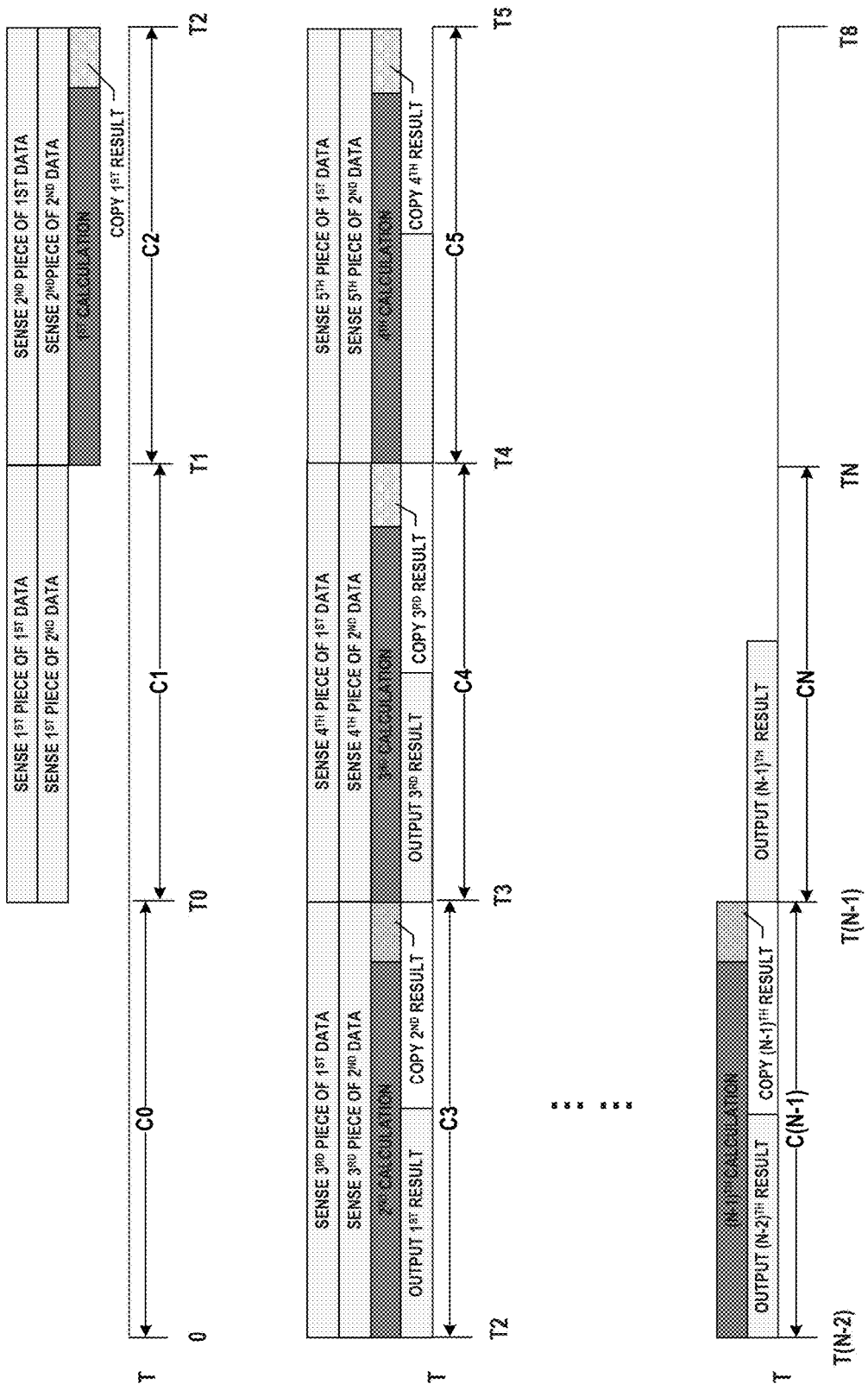
FIG. 5 illustrates an operation pipeline of the memory device, according to some aspects of the present disclosure.

In some implementations, referring to FIG. 5, and operation pipeline of one process unit 80 is illustrated. As described above, the first data includes at least one row, and control logic 75 is configured to control page buffers 71 to receive each row of the first data based on a first data pattern.

The first data pattern includes N first data segments with equal data length, where N is a positive integer and N≥2, and a sequence of the N first data segments of the first data pattern is the same as a sequence of the first data. The data length of each first data segment is less than or equal to the bandwidth of data-path bus 81. In the present implementation, as shown FIG. 2C, each piece of the first data includes a first data segment, for example, the first piece of first data can be first data segment S1-0, the second piece of first data can be first data segment S1-1, the third piece of first data can be first data segment S1-2, and the fourth piece of first data can be first data segment S1-3. In some implementation, the Nth piece of first data can be first data segment S1-(N−1). In some implementations, each piece of the first data can includes a data segment longer or shorter than the first data segment based on a bandwidth of the data-path bus 81 and other data width of peripheral circuit 70.

The second data includes M columns, where M is a positive integer and M≥2. Control logic 75 is configured to program each column of the second data into the memory cells based on a second data pattern. In some implementations, control logic 75 is configured to program the second data into the memory cells as single-level memory cells (SLC). The second data pattern includes N data groups each having M second data segments with equal data length from the M columns of the second data respectively, and the first data segment and the second data segment are configured to share an equal data length. In some implementations, each piece of the second data corresponds with the piece of first data to be multiplied with, for example, the first piece of the second data can be the six second data segments S2-0 of the first data group of the second data that will be multiplied with the first data segment S1-0, the second piece of the second data can be the six second data segments S2-1 of the second data group of the second data that will be multiplied with the first data segment S1-1, the third piece of the second data can be the six second data segments S2-2 of the third data group of the second data that will be multiplied with the first data segment S1-2, and the fourth piece of the second data can be the six second data segments S2-0 of the fourth data group of the second data that will be multiplied with the first data segment S1-3. In some implementations, the Nth piece of the second data can be the six second data segments S2-(N−1) of the Nth data group of the second data that will be multiplied with the first data segment S1-(N−1).

In some implementations, the operation pipeline shown in FIG. 5 is performed by at least one process element 82 of each process unit 80. Control logic 75 is configured to control page buffers 71 to send the ith first data segment to each process element 82 and control page buffers 71 to send the M second data segments to the M process elements 82. Each of the at least one process unit 80 includes a control element 84 configured to assign the M second data segments to the M process elements one-by-one based on the sequence of the M second data segments.

Referring to FIG. 5, an initial cycle C0 is configured for preparation of process unit 80. The operation pipeline starts from a first cycle C1, in which a first piece of first data is obtained by page buffers 71 and send to process elements 82 of process unit 80, while a first piece of second data is sensed by page buffers 71 and send to process elements 82 of process unit 80.

In a second cycle C2 consecutive of the first cycle C1, a first calculation is performed by process elements 82 and a first result is generated based on the first piece of first data and the first piece of second data. The first result is copied by control logic 75 at the end of the second cycle C2. At the same time, a second piece of first data is sensed by page buffers 71 and sent to process elements 82, while a second piece of second data is sensed by page buffers 71 and send to process elements 82.

Consecutively, in a third cycle C3, the first result is sent to data interface 79, which costs much less time than sensing data or performing calculations, thus the outputting of the first result can be performed any time during the third cycle C3. During the third cycle C3, a second calculation is performed by process elements 82 and a second result is generated based on the second piece of first data and the second piece of second data. The second result is copied by control logic 75 at the end of the second cycle C2. At the same time, a third piece of first data is sensed by page buffers 71 and sent to process elements 82, while a third piece of second data is sensed by page buffers 71 and sent to process elements 82.

Consecutively, in a fourth cycle C4, the second result is sent to data interface 79, while a third calculation is performed by process elements 82 and a third result is generated based on the third piece of first data and the third piece of second data. At the same time, a fourth piece of first data is obtained by page buffers 71 and sent to process elements 82, while a fourth piece of second data is sensed by page buffers 71 and sent to process elements 82. Similarly, in a ith cycle Ci, the (i−2)th result is sent to data interface 79, while an (i−1)th calculation is performed by process elements 82 and a (i−1)th result is generated based on the (i−1)th piece of first data and the (i−1)th piece of second data. At the same time, an ith piece of first data is obtained by page buffers 71 and sent to process elements 82, while an ith piece of second data is sensed by page buffers 71 and send to process elements 82. With the application of the operation pipeline in FIG. 5, the sensing of the first and second data, the performing of the convolution calculation, and the outputting of the calculation result can be completed within a single cycle to improve the calculation effective. In some implementations, only the sensing of the first and second data and the performing of the convolution calculation.

A system including a memory device and a memory controller is provided according to an aspect of the present disclosure. The memory device includes an array of memory cells and a peripheral circuit coupled to the memory cells. The peripheral circuit includes page buffers configured to obtain first data from the data interface and sense second data from the array of memory cells, and at least one process unit coupled to the page buffers via a data-path bus of the peripheral circuit and configured to perform calculation based on the first data and the second data. The controller is coupled with the memory device and configured to transmit the first data into the memory device and receive a result of the calculation from the memory device.

In some implementations, the system can be any electrical system applied with an AI system, such as computers, digital cameras, mobile phones, smart electrical appliances, Internet of Things (IoT), servers, base stations, and the like. In the present disclosure, data processing and computing of the AI system can be performed by process units 80 of peripheral circuit of a memory device. In some implementations, computing tasks consuming a large number of resources can be distributed to memory device rather than the TPU or a graphic processing unit (GPU) by adding at least one process unit into the memory device to improve the performance of the AI system. The number of process units can be designed based on the needs of the AI system. The more process units are integrated into the memory device, the higher effective the AI system will be.

Figure 6:
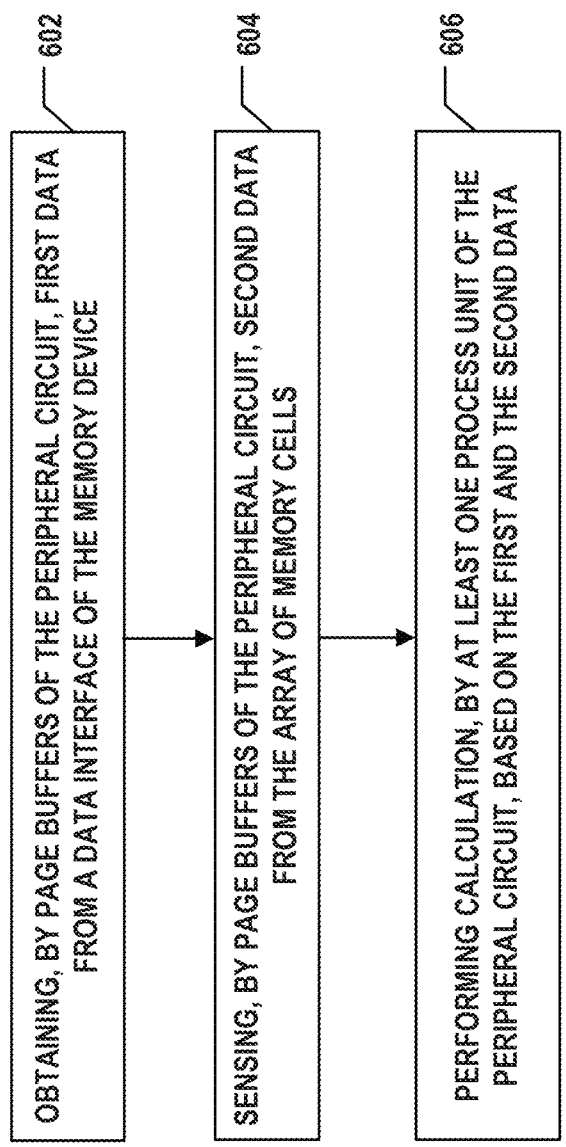
FIG. 6 illustrates a flowchart of a method for data calculation with a memory device, according to some aspects of the present disclosure.

Referring to FIG. 6, FIG. 6 illustrates a flowchart of a method 600 for data calculation with a memory device including array of memory cell array 62 and peripheral circuit 70 coupled to the memory cell array 62, the memory device can be the same as described above and will not be repeated herein. It is understood that the operations shown in method 600 are not exhaustive and that other operations can be performed as well before, after, or between any of the illustrated operations. Further, some of the operations may be performed simultaneously, or in a different order than shown in FIG. 6.

As shown in FIG. 6, method 600 can start at operation 602, in which first data is obtained from a data interface of the memory device by page buffers of the peripheral circuit. Method 600 can start at operation 604, in which second data is sensed from the array of memory cells by the page buffers. It should be noted that there is no limitation on the performance of operation 602 and operation 604. Operation 602 can be performed before, after, or simultaneous with operation 604. In some implementations, to improve the computing effectiveness of the memory device, operation 602 and operation 604 can be performed during a same time period. The sequence of operations 602 and 604 should not limit the scope of the present disclosure.

In some implementations, the first data may be a one-dimensional data and the second data may be a two-dimensional data in many cases, as shown in FIG. 2A, in which the first data is a one-dimensional vector, and the second data is a two-dimensional matrix. In some implementations, the one-dimensional first data can be equivalated as a row of data with a length of a, and the two-dimensional second data, i.e., the a×b matrix, can be equivalated as b columns, each column has a length of a. In some implementations, the first data can be a two-dimensional matrix including more than one row with an equal data length, and a dimensionality reduction can be performed on the more than one row of the first data to break the first data into a plurality of single row to apply the present disclosure.

In some implementations, the first data and second data can be preprocessed before operation 602 and 604. In some implementations, the first data and second data can be preprocessed based on a first data pattern and a second data pattern as shown in FIG. 2C.

In some implementations, the first data includes one row. The first data is obtained by page buffers 71 from data interface 79 and is sent to the at least one process unit 80 based on a first data pattern as shown in FIG. 2C and FIG. 2D. The first data pattern includes N first data segments with equal length, where N is a positive integer and N≥2. In some implementations, referring to FIG. 2D, every two adjacent first data segments of the first data pattern are separated by M first blank segments. For example, N=4 is taking as an example to illustrate the present disclosure, referring to FIG. 2D, the first data includes four first data segments based on the first data pattern, i.e., first data segment S1-0, first data segment S1-1, first data segment S1-2, and first data segment S1-3. Six first blank segments are arranged between first data S1-0 and first data segment S1-1, six first blank segments are arranged between first data segment S1-1 and first data segment S1-2, six first blank segments are arranged between first data segment S1-2 and first data segment S1-3, six first blank segments are arranged between first data segment S1-3 and consecutive first data segment.

The sequence of the four first data segments of the first data pattern is the same as a sequence of the first data. In some implementations, the data length of each first data segment is less than or equal to the bandwidth of the data-path bus. The first data segments and the first blank segments are configured to have equal data length. In some implementations, an error checking and correcting (ECC) code is assigned to each first data segment to verify the first data segment. The ECC code can also be used as an identifier to recognize each first data segment of the first data pattern.

In some implementations, the second data includes M columns, where M is a positive integer and M≥2. The second data is programmed into the memory cells of memory cell array 62 based on a second data pattern as shown in FIG. 2C and FIG. 2E. The second data pattern includes N data groups each having M second data segments with equal data length from the M columns of the second data respectively, and the first data segment and the second data segment are configured to share an equal data length. Every two adjacent data groups of the N data groups of the second data pattern are separated by one second blank segment, and each second blank segment is corresponded to a first data segment respectively. For example, N=4 and M=6 are taking as examples to illustrate the present disclosure. As shown in FIG. 2C, the second data includes six columns, i.e., Column 1, Column2, Column3, Column4, Column5, and Column6. Each column of the six columns includes four second data segments, i.e., second data segment S2-0, second data segment S2-1, second data segment S2-2, and second data segment S2-3. Referring to FIG. 2C, the six second data segments S2-0 are regrouped as a first data group of the second data pattern, the six second data segments S2-1 are regrouped as a second data group of the second data pattern, the six second data segments S2-2 are regrouped as a third data group of the second data pattern, and the six second data segments S2-3 are regrouped as a fourth data group of the second data pattern. Referring to FIG. 2E, the first data group of the second data is separated from a proceeding data group of the second data by second blank segment S2-0, the second data group of the second data is separated from the first data group of the second data by second blank segment S2-1, the third data group of the second data is separated from the second data group of the second data by second blank segment S2-2, and the fourth data group of the second data is separated from the third data group of the second data by second blank segment S2-3.

In some implementations, referring to FIG. 2C and FIG. 2E, each data group of the four data groups of the second data pattern are programmed into the memory cell array 62 successively, i.e., logic addresses of the data of each data group are successive, so that the data of a same data group can be sensed into page buffers 71 at the same time. For example, in some implementations, six second data segments S2-0 of the first data group and one second blank segment S2-B are successively programmed in block 0 of memory cell array 62, six second data segments S2-1 of the second data group and one second blank segment S2-B are successively programmed in block 1 of memory cell array 62, six second data segments S2-2 of the third data group and one second blank segment S2-B are successively programmed in block 2 of memory cell array 62, and six second data segments S2-3 of the first data group and one second blank segment S2-B are successively programmed in block 3 of memory cell array 62.

In some implementations, a capacity of each block of memory cell array 62 is larger than at least twice of a data length of each data group, then two more data groups can be programmed within a same block of memory cell array 62 successively. In some implementations, the capacity of each block of memory cell array 62 is less than the data length of each data group, then each data group can be programmed in two successive blocks of memory cell array 62. The sequence of the second data segments of the second data pattern is the same as a sequence of the second data. In some implementations, the data length of each second data segment is less than or equal to the bandwidth of the data-path bus. The first data segments, the first blank segments, the second data segments, and the second blank segments are configured to have equal data length. In some implementations, an error checking and correcting (ECC) code is assigned to each second data segment to verify the second data segment. The ECC code can also be used as an identifier to recognize each second data segment of the second data pattern.

In some implementations, referring to FIG. 2F, the first data and the second data are sent to the at least one process unit 80 based on the data sequence of the first data pattern and the second data pattern in FIG. 2C.

In some implementations, the first data is obtained into a second latch of page buffers 71 from data interface 79 based on the first data pattern, as shown in FIG. 2D and FIG. 2F, every two adjacent first data segments are separated by M first blank segments. The second data is sensed into a first latch of page buffers 71 from memory cell array 62 based on the second data pattern, as shown in FIG. 2E and FIG. 2F, every two adjacent data group of the second data are separated by one second blank segment.

In some implementations, third data having a third data pattern by performing an OR operation on the first data and the second data, which means that the first blank segments and second blank segments are replaced by the corresponding second data segments and first data segments after the OR operation or the AND operation. The third data can be saved into a third data latch of page buffer 71 or can be saved back into the first or the second data latch. The third data pattern includes the N first data segments from the first data pattern and the N data groups each having M second data segments from the second data pattern. The M first blank segments between an ith first data segment and an (i+1)th first data segment of the N first data segments are replaced by the M second data segments of an ith data group of the N data groups, where i is a positive integer and N≥i≥1.

As shown in FIG. 6, method 600 can start at operation 606, in which calculation is performed by at least one process unit of the peripheral circuit based on the first and the second data.

In some implementations, operation 606 includes performing convolution operations by the M process elements 82 of each process unit 80 based on an ith first data segment of the N first data segments and the M second data segments of an ith data group of the N data groups, where i is a positive integer and N≥i≥1. Referring to FIG. 3A and FIG. 3B, in the present implementation, the first data segment S1-0 is sent to each of the six process elements 82, the six second data segments S2-0 of the first data group of the second data are sent to the six process elements 82 one-by one, and convolution operations are performed by the six process elements 82 based on the first data segment S1-0 and the six second data segments S2-0 and obtain a first calculation result. The first calculation result is then sent to data interface 79 by control logic 75. The first data segment S1-1 and the six second data segments S2-1 are then sent to the six process elements 82 to perform convolution operations and generate a second calculation result. The second calculation result is then sent to data interface 79 by control logic 75 consecutively.

A calculation principle of the at least one process unit is provided in FIG. 4, in which the ith first data segment is multiplied with the M second data segments of an ith data group of the N data groups to obtain an ith result. The N ith results are accumulated to obtain a convolution result. In some implementations, peripheral circuit 70 includes one process unit 80, then the convolution operations between the calculations N first data segments and the N data groups of the second data are performed by the one process unit 80 consecutively. In some implementations, peripheral circuit 70 includes more than one process unit 80, then the convolution operations between the calculations N first data segments and the N data groups of the second data are performed by different process unit 80 at the same time respectively.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described implementations but should be defined only in accordance with the following claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, and rearranged with one another and in ways that are consistent with the scope of the present disclosure.

What is claimed is:

1. A memory device comprising:
    an array of memory cells; and
    a peripheral circuit coupled to the array of memory cells and comprising:
        page buffers configured to store first data comprising at least one row transmitted from a data interface of the memory device and to sense second data comprising at least two columns from the array of memory cells;
        at least one process unit coupled to the page buffers via a data-path bus of the peripheral circuit, and configured to perform calculation based on the first data and the second data; and
        a control logic configured to:
            control the page buffers to receive each row of the first data based on a first data pattern comprising at least two first data segments with equal data length, wherein two adjacent first data segments of the first data pattern are separated by at least two first blank segments; and
            program the at least two columns of the second data into the array of memory cells based on a second data pattern comprising at least two data groups corresponding to the at least two first data segments of the first data pattern respectively.

2. The memory device of claim 1, wherein
the first data pattern comprises N first data segments with equal data length, where N is a positive integer and N≥2;
an order of the N first data segments of the first data pattern matches a sequence of the N first data segments originally arranged in the first data; and
every two adjacent first data segments of the first data pattern are separated by M first blank segments, where M is a positive integer and M≥2.

3. The memory device of claim 2, wherein
the second data comprises M columns; and
the control logic is further configured to program each column of the second data into the memory cells based on a second data pattern.

4. The memory device of claim 3, wherein the control logic is further configured to program the second data into the memory cells in a single-level memory cell (SLC) mode.

5. The memory device of claim 3, wherein
the second data pattern comprises N data groups each having M second data segments with equal data length from the M columns of the second data respectively;
every two adjacent data groups of the N data groups of the second data pattern are separated by one second blank segment, each second blank segment is corresponded to a first data segment respectively; and
the first data segment, the second data segment, the first blank segment, and the second blank segment are configured to have an equal data length.

6. The memory device of claim 5, wherein each second data segment of the M second data segments of each data group of the N data groups is assigned with an error checking and correcting (ECC) code.

7. The memory device of claim 5, wherein the control logic is further configured to control the page buffers to sense the second data from the memory cells into the page buffers based on the second data pattern.

8. The memory device of claim 5, wherein the control logic is further configured to control the page buffers to generate a third data having a third data pattern by performing an OR operation or an AND operation on the first data and the second data.

9. The memory device of claim 8, the third data pattern comprising:
the N first data segments from the first data pattern; and
the N data groups each having M second data segments from the second data pattern, wherein the M first blank segments between an ith first data segment and an (i+1)th first data segment of the N first data segments are replaced by the M second data segments of an ith data group of the N data groups, where i is a positive integer and N≥i≥1.

10. The memory device of claim 9, wherein each of the at least one process unit comprises M process elements configured to:
perform convolution operations based on the ith first data segment of the N first data segments and the M second data segments of an ith data group of the N data groups.

11. The memory device of claim 10, wherein the control logic is further configured to control the page buffers to send the ith first data segment and the M second data segments to the M process elements.

12. The memory device of claim 11, wherein each of the at least one process unit comprises a control element configured to:
assign the ith first data segment to each process element of the M process elements; and
assign the M second data segments to the M process elements one-by-one based on a sequence of the M second data segments originally arranged in the second data.

13. The memory device of claim 11, wherein
the array of memory cells is divided into more than one plane of memory cells;
a number of the at least one process unit is equal to a number of the planes of memory cells; and
each process unit corresponds to a corresponding one of the more than one planes of memory cells respectively.

14. The memory device of claim 11, wherein
the array of memory cells is divided into more than one plane of memory cells; and
a number of the at least one process unit is less than a number of the planes of memory cells.

15. The memory device of claim 1, wherein the memory device comprises a NAND flash memory.

16. A method for data calculation with a memory device comprising an array of memory cells and a peripheral circuit coupled to the memory cells, comprising:
obtaining, by page buffers of the peripheral circuit, first data comprising at least one row from a data interface of the memory device;
sensing, by the page buffers of the peripheral circuit, second data comprising at least two columns from the array of memory cells;
receiving, by page buffers of the peripheral circuit, each row of the first data based on a first data pattern comprising at least two first data segments;
programming the at least two columns of the second data into the array of memory cells based on a second data pattern comprising at least two data groups corresponding to the at least two first data segments of the first data pattern respectively; and
performing a calculation, by at least one process unit of the peripheral circuit, based on the first data in the first data pattern and the second data in the second data pattern.

17. The method of claim 16, further comprising:
programming the second data into the array of memory cells.

18. A system, comprising:
a memory device comprising:
an array of memory cells; and
a peripheral circuit coupled to the memory cells and comprising:
page buffers configured to store first data comprising at least one row transmitted from a data interface of the memory device and to sense second data comprising at least two columns from the array of memory cells; and
at least one process unit coupled to the page buffers via a data-path bus of the peripheral circuit, and configured to perform calculation based on the first data and the second data; and
a controller coupled with the memory device and configured to:
transmit each row of the first data into the memory device based on a first data pattern comprising at least two first data segments with equal data length, wherein two adjacent first data segments of the first data pattern are separated by at least two first blank segments;

program the at least two columns of the second data into the array of memory cells based on a second data pattern comprising at least two data groups corresponding to the at least two first data segments of the first data pattern respectively; and receive a result of the calculation from the memory device.

19. The system of claim 18, wherein the memory device is a NAND flash memory.

20. The memory system of claim 18, wherein
the first data pattern comprises more than two first data segments with equal data length, an order of the more than two first data segments matches a sequence of the more than two first data segments originally arranged in the first data, and every two adjacent first data segments of the first data pattern are separated by more than two first blank segments;

the second data pattern comprises more than two data groups each having more than two second data segments with equal data length from the more than two columns of the second data respectively, every two adjacent data groups of the more than two data groups of the second data pattern are separated by one second blank segment, each second blank segment is corresponded to a first data segment respectively; and the first data segment, the second data segment, the first blank segment, and the second blank segment are configured to have an equal data length.

* * * * *